United States Patent
Babu et al.

(10) Patent No.: US 7,629,258 B2
(45) Date of Patent: *Dec. 8, 2009

(54) METHOD FOR ONE-TO-ONE POLISHING OF SILICON NITRIDE AND SILICON OXIDE

(75) Inventors: Suryadevara V. Babu, Potsdam, NY (US); Anita Natarajan, Potsdam, NY (US)

(73) Assignees: Clarkson University, Potsdam, NY (US); Infotonics Technology Center Inc., Canandaigua, NY (US)

( * ) Notice: Subject to any disclaimer, the term of this patent is extended or adjusted under 35 U.S.C. 154(b) by 9 days.

This patent is subject to a terminal disclaimer.

(21) Appl. No.: 11/562,453

(22) Filed: Nov. 22, 2006

(65) Prior Publication Data

US 2008/0116172 A1  May 22, 2008

(51) Int. Cl.
*H01L 21/302* (2006.01)
*H01L 21/461* (2006.01)

(52) U.S. Cl. .................. 438/691; 438/692; 438/693

(58) Field of Classification Search .................. None
See application file for complete search history.

(56) References Cited

U.S. PATENT DOCUMENTS

| | | |
|---|---|---|
| 6,436,834 B1 | 8/2002 | Lee et al. |
| 6,491,843 B1 | 12/2002 | Srin et al. |
| 6,533,832 B2 | 3/2003 | Steckenrider et al. |
| 6,544,892 B2 | 4/2003 | Srinivasan et al. |
| 6,702,954 B1 | 3/2004 | Her et al. |
| 7,005,382 B2 | 2/2006 | Nishimoto et al. |
| 2003/0110710 A1* | 6/2003 | Oshima et al. ............. 51/307 |
| 2003/0176151 A1 | 9/2003 | Tam et al. |
| 2004/0132305 A1 | 7/2004 | Nishimoto et al. |
| 2004/0152309 A1 | 8/2004 | Carter et al. |
| 2004/0186206 A1 | 9/2004 | Yoneda et al. |
| 2005/0028450 A1 | 2/2005 | Xu et al. |
| 2005/0042877 A1* | 2/2005 | Salfelder et al. ......... 438/691 |
| 2005/0079709 A1* | 4/2005 | Delehanty et al. ........ 438/689 |
| 2005/0136673 A1 | 6/2005 | Xu et al. |
| 2006/0216935 A1* | 9/2006 | Oswald et al. ........... 438/691 |
| 2007/0093182 A1* | 4/2007 | Kollodge ..................... 451/41 |

OTHER PUBLICATIONS

Natarajan, Anita; Hedge, Sharath; and Babu, S.V.; Selective chemical-mechanical planarization of polysilicon during fabrication of MEMS devices; poster; Mar. 28, 2005; exhibited during the Materials Research Society Spring Meeting in San Francisco, California.

Carter, Philip W.; and Johns, Timothy P.; Interfacial Reactivity Between Ceria and Silicon Dioxide and Silicon Nitride Surfaces, Organic Additive Effects; Electrochemical and Solid-State Letters, 8 G218-G221 (2005); The Electrochemical Society, Inc.

Anjur, Sriram; Dysard, Jeffrey; Feeney; Paul; Johns, Timothy; Kason, Mark; Perez, Maria; and Romine, Richard; Selective Silicon Nitride Polishing; presentation paper; Oct. 10, 2006; 2006 International Conference on Planarization/CMP Technology; Foster City, California.

Kim, Sang-Kyun; Sohn, Hyung-Min; Paik, Ungyu; Katoh, Takeo; and Park, Jea-Gun; A Reverse Selectivity Ceria Slurry for the Damascene Gate Chemical Mechanical Planarization Process; Japanese Journal of Applied Physics, vol. 43, No. 11A, 2004, pp. 7434-7438; The Japan Society of Applied Physics.

Commonly Owned Application Serial No. 11562443, filed Nov. 22, 2006.

Commonly Owned Application Serial No. 11562447, filed Nov. 22, 2006.

* cited by examiner

*Primary Examiner*—Duy-Vu N Deo
(74) *Attorney, Agent, or Firm*—Rankin, Hill & Clark LLP

(57) ABSTRACT

The present invention provides a method of removing silicon nitride at about the same removal rate as silicon dioxide by CMP. The method utilizes a polishing slurry that includes colloidal silica abrasive particles dispersed in water and additives that modulate the silicon dioxide and silicon nitride removal rates such that they are about the same. In one embodiment of the invention, the additive is lysine or lysine mono hydrochloride in combination with picolinic acid, which is effective at a pH of about 8. In another embodiment of the invention, the additive is arginine in combination with picolinic acid, which is effective at a pH of about 10.

5 Claims, No Drawings

METHOD FOR ONE-TO-ONE POLISHING OF SILICON NITRIDE AND SILICON OXIDE

The U.S. Government has a paid-up license in this invention and the right in limited circumstances to require the patent owner to license others on reasonable terms as provided for by the terms of Grant No. NAG3-2744 awarded by NASA. The Government has certain rights in the invention.

BACKGROUND OF THE INVENTION

1. Field of Invention

The present invention relates to compositions and methods for removing silicon nitride and silicon dioxide at about the same removal rate by chemical-mechanical polishing.

2. Description of Related Art

Silicon nitride is widely used as a barrier layer and/or as an etch stop layer to protect underlying devices from being removed during chemical-mechanical polishing (CMP) in integrated circuit (IC) fabrication. Accordingly, most CMP polishing slurries and processes have attempted to minimize the silicon nitride removal rate while attaining relatively high removal rates for other layers. CMP polishing slurries and processes that are highly selective for silicon dioxide in preference to silicon nitride have been developed and utilized in the shallow trench isolation (STI) manufacturing process.

There are emerging technologies in the semiconductor industry where it would be advantageous to have CMP slurries and processes whereby the removal rate of silicon nitride is about the same as the removal rate of silicon dioxide. Suppressing the silicon dioxide removal rate while at the same time achieving a substantially equal silicon nitride removal rate is immensely challenging because the removal of silicon nitride via CMP typically follows a mechanism in which the surface of the silicon nitride is hydrolyzed to silicon dioxide ($Si_3N_4 + 6H_2O \rightarrow 3SiO_2 + 4NH_3$), which is then removed during CMP. Accordingly, additives conventionally used in CMP slurries to suppress the silicon dioxide removal rate tend to suppress the silicon nitride removal rate because the silicon nitride is converted to silicon dioxide and removed as such.

SUMMARY OF INVENTION

The present invention provides a method of removing silicon nitride at about the same removal rate as silicon dioxide by CMP. The method utilizes a polishing slurry that includes colloidal silica abrasive particles dispersed in water and additives that modulate the silicon dioxide and silicon nitride removal rates such that they are about the same. In one embodiment of the invention, the additive is lysine or lysine mono hydrochloride in combination with picolinic acid, which is effective at a pH of about 8. In another embodiment of the invention, the additive is arginine in combination with picolinic acid, which is effective at a pH of about 10. Applicants hypothesize that the positively charged amino acid constituent of the additive (lysine mono hydrochloride, lysine and arginine) becomes adsorbed on the negatively charged silica abrasive particles and the silicon dioxide film. This would typically cause suppression of the silicon dioxide removal rate due to electrostatic repulsion. However, the presence of picolinic acid in the slurry increases the silicon dioxide removal rate. The combination of arginine and lysine with picolinic acid is used in order to modulate the silicon dioxide removal rate such that it is equal to the silicon nitride removal rate.

On the other hand, lysine at pH 8 may not adsorb on the silicon nitride film as pH 8 is far from the IEP of silicon nitride (9.7), and arginine adsorbs on the silicon nitride film at pH 10. In both cases, picolinic acid adsorbs to the silicon nitride film, and silica abrasives when used with picolinic acid enhance the silicon nitride removal rate. The lysine coated silica abrasive also contributes to the increase in the silicon nitride removal rate. The compositions of the positively charged amino acids and picolinic acid are chosen such that the silicon dioxide and silicon nitride removal rates are about the same.

The foregoing and other features of the invention are hereinafter more fully described and particularly pointed out in the claims, the following description setting forth in detail certain illustrative embodiments of the invention, these being indicative, however, of but a few of the various ways in which the principles of the present invention may be employed.

DETAILED DESCRIPTION OF THE PREFERRED EMBODIMENTS

The method of the present invention comprises disposing a polishing slurry between a polishing pad and a surface comprising silicon nitride (sometimes abbreviated as "$Si_3N_4$") and silicon dioxide (sometimes abbreviated as "$SiO_2$") and pressing the polishing pad against the surface while the polishing pad and surface are moving relative to each other with the polishing slurry disposed therebetween to remove silicon nitride and silicon dioxide from the surface at about the same removal rate.

The removal rates are about the same when the ratio of the removal rate of silicon dioxide to silicon nitride is suitably in the range of about 0.3 to about 3, desirably in the range of about 0.5 to about 2, preferably in the range of about 0.7 to about 1.3, and most preferably about 1.

The silicon nitride and/or the silicon dioxide can be in the form of a surface film, which may overly or lay next to a film of the other material. The surface may also comprise one or more additional materials, such as polysilicon, for example.

The polishing slurry used in accordance with the method of the invention preferably comprises colloidal silica abrasive particles dispersed in water and additives that modulate the silicon dioxide and silicon nitride removal rates such that they are about the same.

Desirable additive compounds include organic compounds containing an alpha-amino carboxylic acid functional group and an additional functional group, wherein the additional functional group comprises an amino group or a guanidine group.

Organic compounds that have an amino group and an acid group attached to the same carbon are referred to as alpha-amino carboxylic acids. Many alpha-amino carboxylic acid compounds are known and there are twenty "natural" amino acids, that is, amino acids that are used as basic components of proteins in living organisms.

In addition to an amino acid functional group, desirable additive compounds have an additional functional group, which can be protonated and consequently can acquire a positive charge. Useful functional groups include amino groups and guanidine groups. In particular, primary amino groups having a pKa of about 9.0 or greater are desirable.

An example of a compound having both an alpha-amino carboxylic acid functional group and an additional amino functional group is lysine. Arginine is an example of a compound having both an alpha-amino carboxylic acid functional group and an additional guanidine substituent. In one embodiment the additive compound is selected from the group consisting of arginine, lysine and lysine mono hydrochloride. Illustrative useful compounds are listed below.

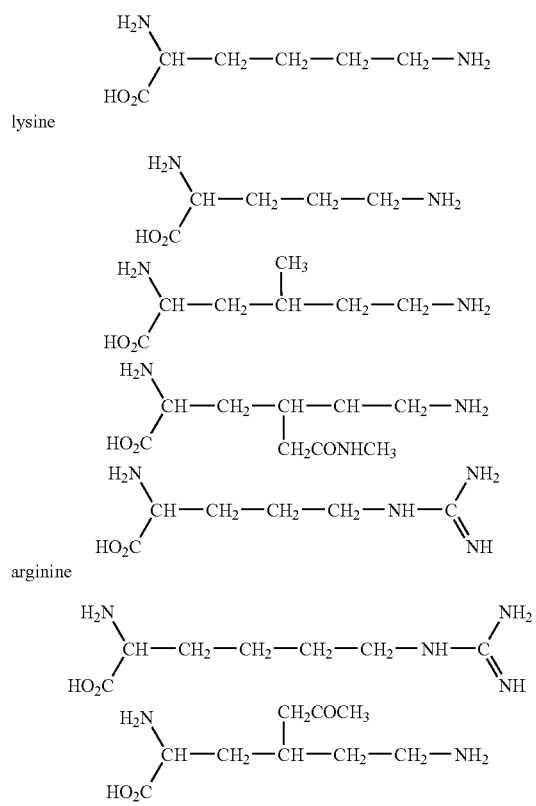

lysine arginine

In one embodiment of the invention, the additive includes an alpha-amino carboxylic acid compound containing an additional amino group, and the pH of the slurry is in the range of about 7.5 to about 8.5, that is, about 8±0.5. In another embodiment of the invention, the additive includes an alpha-amino carboxylic acid compound containing an additional guanidine group, and the pH of the slurry is in the range of about 9.5 to about 10.5, that is, about 10±0.5.

In addition to the additive compound, a second compound is also present, wherein the second compound is picolinic acid or a derivative thereof. Useful derivatives of picolinic acid include compounds of formula 1, wherein $r_1$-$r_4$ independently represent hydrogen or a substituent such as, for example, a substituted or unsubstituted alkyl group, such as a methyl or ethyl group, a halogen, such as a chloro group, or a substituted or unsubstituted aromatic group such as a phenyl group. In one desirable embodiment, $r_1$-$r_4$ represent hydrogen and formula 1 represents picolinic acid.

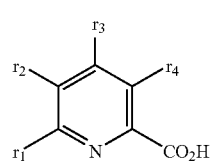

1

In one embodiment of the invention, the additive is lysine or lysine mono hydrochloride, which is effective at a pH of about 8. In another embodiment of the invention, the additive is arginine in combination with picolinic acid, which is effective at a pH of about 10.

The colloidal silica particles present in the polishing slurry preferably have a mean average diameter of from about 25 nm to about 75 nm, and more preferably of about 50 nm.

The amino acid component of the additive (the first compound) is preferably present in an amount from about 1.0% to about 4.0% by weight, and more preferably, from about 2.0% to about 3.0% by weight. The second compound, picolinic acid or a derivative thereof, is typically added in an amount from about 1.0% to about 3.0% by weight. The composition of the polishing pad is not per se critical, and conventional polishing equipment can be used.

Applicants hypothesize that lysine or lysine mono hydrochloride and arginine are positively charged at pH 8 and 10 respectively. In both instances, the silicon dioxide surface (i.e., the surface of the colloidal silica abrasive particles and any silicon dioxide surface films) are negatively charged. Therefore, due to electrostatic interactions, the positively charged amino acid component will adsorb onto the colloidal silica abrasive as well as on any silicon dioxide surface films. This would typically cause suppression of the silicon dioxide removal rate due to electrostatic repulsion. However, the presence of picolinic acid in the slurry increases the silicon dioxide removal rate. The combination of arginine and lysine with picolinic acid is used in order to modulate the silicon dioxide removal rate such that it is equal to the silicon nitride removal rate.

On the other hand, lysine at pH 8 may not adsorb on the silicon nitride film as pH 8 is far from the IEP of silicon nitride (9.7), and arginine adsorbs on the silicon nitride film at pH 10. In both cases, picolinic acid, which has a pKa of about 6, adsorbs to the silicon nitride film, and silica abrasives when used with picolinic acid enhance the silicon nitride removal rate. The lysine coated silica abrasive also contributes to the increase in the silicon nitride removal rate. The compositions of the positively charged amino acids and picolinic acid are chosen such that the silicon dioxide and silicon nitride removal rates are about the same.

Another aspect of the invention includes a device including silcon, for example, a device including silicon dioxide or silicon nitride, fabricated by the methods of the present invention. Examples of useful devices include integrated circuits, micro-electro-mechanical devices, and micro-opto-electro-mechanical (MEMS) devices.

The following examples are intended to illustrate the invention without limiting it in any way. All raw materials referenced in the examples are standard pigment grade powders unless otherwise indicated.

EXAMPLE

Five CMP slurries were separately prepared by dispersing 10% by weight of colloidal silica particles having a mean size of about 50 nm in water. The additives listed in Table 1 below in weight percent were added to the respective CMP slurries (where "Lys" means lysine; "Arg" means arginine; "LysHCl" means lysine mono hydrochloride; and "Pico" means picolinic acid). The pH of the CMP slurries was adjusted as shown in Table 1 below by adding a sufficient amount of potassium hydroxide.

The CMP slurries were then separately used to polish blanket silicon dioxide and silicon nitride films for one minute using a Westech-372 polisher using a down force as shown in Table 1, a carrier/platen speed of 75/75 rpm, a slurry flow rate of 200 ml/min and an IC-1400, k-groove polishing pad. The polishing pad was conditioned for one minute before every polishing experiment. The removal rates of reported in Table 1 are an average of the removal rates of two wafers each of silicon dioxide and silicon nitride.

TABLE 1

| Sample | Additive | pH | Operating Pressure | SiO$_2$ RR (nm/min) | Si$_3$N$_4$ RR (nm/min) | Selectivity SiO$_2$:Si$_3$N$_4$ |
|---|---|---|---|---|---|---|
| 1A | None | 9 | 4 psi | 32 ± 8 | 12 ± 3 | ~2.7 |
| 1B | Lys - 1 wt % Pico - 0.5 wt % | 8 | 4 psi | 62 ± 14 | 59 ± 10 | ~1 |
| 1C | LysHCl - 2 wt % Pico - 1 wt % | 8 | 4 psi | 57 ± 4 | 64 ± 10 | ~0.9 |
| 1D | LysHCl - 1 wt % Pico - 1 wt % | 8 | 4 psi | 73 ± 17 | 55 ± 10 | ~1.3 |
| 1E | Arg - wt % Pico - 0.5 wt % | 10 | 4 psi | 5 ± 3 | 6 ± 2 | ~0.8 |

The data in Table 1 shows that it is possible to use colloidal silica-based slurries to remove silicon nitride and silicon dioxide at about the same removal rate by CMP.

Additional advantages and modifications will readily occur to those skilled in the art. Therefore, the invention in its broader aspects is not limited to the specific details and illustrative examples shown and described herein. Accordingly, various modifications may be made without departing from the spirit or scope of the general inventive concept as defined by the appended claims and their equivalents.

What is claimed is:

1. A method for removing silicon nitride and silicon dioxide from a surface, the method comprising:
    a) providing a polishing slurry having a pH of about 8±0.5 that comprises colloidal silica abrasive particles dispersed in water and an additive comprising:
        i) about 1.0% to about 4.0% by weight of lysine mono hydrochloride; and
        ii) picolinic acid or a derivative thereof;
    b) disposing the polishing slurry between a polishing pad and the surface; and
    c) pressing the polishing pad against the surface while the polishing pad and surface are moving relative to each other with the polishing slurry disposed therebetween to remove silicon nitride from the surface at about the same rate as silicon dioxide is removed from the surface.

2. The method according to claim 1 wherein the polishing slurry comprises from about 5% to about 15% by weight of silica particles having a mean average diameter of from about 25 nm to about 75 nm.

3. The method according to claim 1 wherein the polishing slurry comprises from about 1.0% to about 3.0% by weight of picolinic acid.

4. The method according to claim 1 wherein the polishing slurry comprises about 10% by weight of silica particles having a mean average diameter of about 50 nm and from about 1% to about 3% by weight of lysine mono hydrochloride.

5. The method according to claim 4 wherein the polishing slurry comprises from about 1.0% to about 3.0% by weight of picolinic acid.

\* \* \* \* \*